(12) United States Patent
Sohn et al.

(10) Patent No.: US 12,348,070 B2
(45) Date of Patent: Jul. 1, 2025

(54) BATTERY MANAGEMENT DEVICE AND MOBILE ROBOT COMPRISING SAME

(71) Applicant: LG ELECTRONICS INC., Seoul (KR)

(72) Inventors: Byungkon Sohn, Seoul (KR); Sangkyu Yi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 4 days.

(21) Appl. No.: 18/293,433

(22) PCT Filed: Jul. 28, 2022

(86) PCT No.: PCT/KR2022/011098
§ 371 (c)(1),
(2) Date: Jan. 30, 2024

(87) PCT Pub. No.: WO2023/013971
PCT Pub. Date: Feb. 9, 2023

(65) Prior Publication Data
US 2024/0222991 A1    Jul. 4, 2024

(30) Foreign Application Priority Data
Aug. 3, 2021 (KR) .................. 10-2021-0102063

(51) Int. Cl.
*H02J 7/00* (2006.01)
*A47L 9/28* (2006.01)
(Continued)

(52) U.S. Cl.
CPC .......... *H02J 7/0068* (2013.01); *A47L 9/2884* (2013.01); *G01R 19/003* (2013.01);
(Continued)

(58) Field of Classification Search
CPC .......... H02J 7/0068; H02J 7/0047; H02J 7/34; A47L 9/2884; G01R 19/003; G01R 19/16542
See application file for complete search history.

(56) References Cited

U.S. PATENT DOCUMENTS

| | | |
|---|---|---|
| 2015/0266386 A1 | 9/2015 | Matsuda et al. |
| 2021/0223581 A1 | 7/2021 | Saitoh et al. |
| 2022/0013814 A1* | 1/2022 | Kirleis .................. B60L 58/12 |

FOREIGN PATENT DOCUMENTS

| | | |
|---|---|---|
| CN | 1618391 | 5/2005 |
| JP | 2000-324709 | 11/2000 |

(Continued)

OTHER PUBLICATIONS

International Search Report dated Nov. 22, 2022 issued in Application No. PCT/KR2022/011098.
(Continued)

*Primary Examiner* — Carlos Amaya
(74) *Attorney, Agent, or Firm* — KED & ASSOCIATES, LLP

(57) ABSTRACT

The present disclosure includes: a power supply unit which generates an operating power supply voltage from a plurality of batteries; a power connection switching unit which performs connection or disconnection of the power supply unit to or from each of the batteries; a plurality of voltage detection units which detect output voltages output from the respective batteries; a detection connection switching unit which performs connection or disconnection of each of the batteries to or from each of the voltage detection units; and a battery controller which controls the power connection switching unit and the detection connection switching unit based on information input from the voltage detection units, wherein the battery controller selects, as a main battery, one of the plurality of batteries based on the output voltages, (Continued)

selects remaining batteries as an auxiliary battery, and connects the auxiliary battery to the voltage detection units for a first time period, and periodically repeats disconnection for a second time period, wherein the first time period is shorter than the second time period.

21 Claims, 10 Drawing Sheets

(51) Int. Cl.
  *G01R 19/00* (2006.01)
  *G01R 19/165* (2006.01)
  *H02J 7/34* (2006.01)
(52) U.S. Cl.
  CPC ...... *G01R 19/16542* (2013.01); *H02J 7/0047* (2013.01); *H02J 7/34* (2013.01)

(56) References Cited

FOREIGN PATENT DOCUMENTS

| | | |
|---|---|---|
| JP | 2003-235771 | 8/2003 |
| JP | 2015-159841 | 9/2015 |
| JP | 2015-190862 | 11/2015 |
| JP | 2016-220824 | 12/2016 |
| JP | 2019-161889 | 9/2019 |
| KR | 10-1871267 | 6/2018 |

OTHER PUBLICATIONS

Japanese Notice of Allowance dated Nov. 26, 2024 issued in Application No. 2024-506701.

* cited by examiner

BATTERY MANAGEMENT DEVICE AND MOBILE ROBOT COMPRISING SAME

CROSS-REFERENCE TO RELATED PATENT APPLICATIONS

This application is a U.S. National Stage Application under 35 U.S.C. § 371 of PCT Application No. PCT/KR2022/011098, filed Jul. 28, 2022, which claims priority to Korean Patent Application No. 10-2021-0102063, filed Aug. 3, 2021, whose entire disclosures are hereby incorporated by reference.

TECHNICAL FIELD

The present disclosure relates to a battery management device and a mobile robot including the same.

BACKGROUND ART

A mobile robot is a device that performs cleaning by suctioning foreign substances such as dust from the floor or mopping foreign substances on the floor. Recently, a mobile robot capable of performing mopping has been developed.

Dual batteries are used to increase the cleaning time of the mobile robot and facilitate battery replacement. When using dual batteries, the remaining battery capacity is periodically checked, the battery with the most remaining battery is used as the main battery, and the remaining battery is used as the auxiliary battery.

Related art document 1 discloses a technology for selecting a main battery while using dual batteries based on information acquired from each battery and the detected output voltage of each battery.

However, in the case of the related art, a method for checking the remaining battery capacity of an unused auxiliary battery is not disclosed, and a method for reducing power consumption of the auxiliary battery is not disclosed at all.

In the case of the related art, when the remaining battery capacity of the auxiliary battery is repeatedly checked, the power consumption of the auxiliary battery increases and the lifespan of the auxiliary battery is shortened.

RELATED ART DOCUMENT

Patent Document

Japanese Patent Laid-Open Publication No. 2016-220824

DISCLOSURE

Technical Problem

An aspect of the present disclosure is directed to providing a battery management device for increasing battery usage time when using a dual battery and a mobile robot including the same.

Another aspect of the present disclosure is directed to providing a battery management device that reduces power consumption of an auxiliary battery while continuously checking the remaining amount of the auxiliary battery when using a dual battery, and a mobile robot including the same.

Yet another aspect of the present disclosure is directed to providing a battery management device that reduces power consumption of an auxiliary battery while continuously checking for replacement of the auxiliary battery when using a dual battery, and a mobile robot including the same.

Technical Solution

An embodiment of the present disclosure is configured to connect the auxiliary battery to the voltage detection unit for a first time period and periodically repeats disconnection for a second time period, wherein the first time period is shorter than the second time period.

Specifically, an embodiment of the present disclosure includes: a power supply unit which generates an operating power supply voltage from a plurality of batteries; a power connection switching unit which performs connection or disconnection of the power supply unit to or from each of the batteries; a plurality of voltage detection units which detect output voltages output from the respective batteries; a detection connection switching unit which performs connection or disconnection of each of the batteries to or from each of the voltage detection units; and a battery controller which controls the power connection switching unit and the detection connection switching unit based on information input from the voltage detection units, wherein the battery controller selects, as a main battery, one of the plurality of batteries based on the output voltages, selects remaining batteries as an auxiliary battery, and connects the auxiliary battery to the voltage detection units for a first time period, and periodically repeats disconnection for a second time period, wherein the first time period is shorter than the second time period.

The battery controller may detect the output voltage of the auxiliary battery while the auxiliary battery and the voltage detection unit are connected.

The battery controller may calculate a remaining voltage value from the output voltage of the auxiliary battery, and may determine that the auxiliary battery has been removed when the remaining voltage value is less than a first voltage value.

The battery controller may calculate a remaining voltage value from the output voltage of the auxiliary battery, and may determine that the auxiliary battery is installed when the remaining average voltage value is greater than or equal to a first voltage value.

The battery controller may periodically calculate a remaining voltage value from the output voltage of the auxiliary battery, and may compute an initial voltage value of the auxiliary battery when the remaining voltage value is less than a first voltage and then becomes greater than the first voltage or equal to the first voltage.

The initial voltage value of the auxiliary battery may be an average value of output voltage values of the auxiliary battery measured multiple times at an interval of a fourth time during a third time period.

The third time period may be shorter than the second time period and longer than the second time period, the second time period may be longer than the fourth time period, and the first time period may be shorter than the second time period.

The battery controller may compute an initial voltage value of each of the plurality of batteries, select a battery with the largest initial voltage value as the main battery, and select the remaining batteries as the auxiliary battery.

The battery controller may connect the main battery and the power supply unit and disconnect the auxiliary battery and the power supply unit.

The remaining voltage value of the auxiliary battery may be an average value of output voltage values of the auxiliary battery measured multiple times at an interval of a fifth time period during the first time period.

In addition, another embodiment of the present disclosure includes: a power supply unit which generates an operating power supply voltage from a plurality of batteries; a power connection switching unit which performs connection or disconnection of the power supply unit to or from each of the batteries; a plurality of voltage detection units which detect output voltages output from the respective batteries; a detection connection switching unit which performs connection or disconnection of each of the batteries to or from each of the voltage detection units; and a battery controller which controls the power connection switching unit and the detection connection switching unit based on information input from the voltage detection units, wherein the battery controller computes an initial voltage value of each of the batteries, selects, as a main battery, one of the plurality of batteries based on the initial voltage value of each of the batteries, selects remaining batteries as an auxiliary battery, and calculates a remaining voltage value from the output voltage of the auxiliary battery at an interval of a sixth time period, wherein the remaining voltage value is an average value of the output voltage of the auxiliary battery during a seventh time period, and wherein the sixth time period is longer than the seventh time period.

The initial voltage value of each of the batteries may be an average value of output voltage values of each of the batteries measured multiple times at an interval of a fourth time period during a third time period, and the sixth time period may be longer than the third time period.

The third time period may be longer than the seventh time period.

The remaining voltage value may be an average value of output voltage values of the auxiliary battery measured multiple times at an interval of a fifth time period during the seventh time period, and the interval of the fifth time period may be greater than the interval of the fourth time period.

The number of measurements of the output voltage value of the auxiliary battery measured at the fifth time interval may be smaller than the number of measurements of the output voltage value of each of the batteries measured at the interval of the fourth time period.

The battery controller may connect the auxiliary battery and the voltage detection unit for a first time period, periodically repeat disconnection for a second time period, and detect the output voltage of the auxiliary battery while the auxiliary battery and the voltage detection unit are connected.

The battery controller may select a battery with the largest initial voltage value as the main battery and select the remaining batteries as the auxiliary battery.

The battery controller may connect the main battery and the power supply unit and disconnect the auxiliary battery and the power supply unit.

When the remaining average voltage value is less than a first voltage value, the battery controller may determine that the auxiliary battery has been removed.

Additionally, the mobile robot according to an embodiment of the present disclosure includes the battery management device described above.

Advantageous Effects

Through the above solution, an embodiment of the present disclosure uses only one battery with a large remaining battery capacity and does not use the other battery when using a dual battery, thereby increasing the overall battery usage time and storing emergency power for moving to a charging station in case of emergency.

In addition, an embodiment of the present disclosure can increase accuracy by averaging the voltage value of a large number of times when computing the voltage value of a first battery when using a dual battery, and reduce the power consumed in checking the remaining amount of the auxiliary battery by performing the check of the remaining amount of the auxiliary battery more intermittently than computing the voltage value of the first battery.

In addition, an embodiment of the present disclosure intermittently checks the remaining amount of the auxiliary battery when using a dual battery, determines whether the battery needs to be replaced. When it is determined that the battery has been replaced, the voltage value of the first battery is computed by averaging the voltage values of a large number of times. When a battery is replaced, the exact output voltage value of the battery can be obtained, while reducing power consumption when checking the remaining amount of the auxiliary battery.

In addition, an embodiment of the present disclosure uses a dual battery, so that the mobile robot may not be turned off while replacing one of the plurality of batteries. Even when the battery is replaced, information about an cleaning area and information about the cleaning command can be maintained.

MODE FOR DISCLOSURE

The use of terms, in front of which adjectives such as "first", "second", and "third" are used to describe constituent elements mentioned below, is intended only to avoid confusion of the constituent elements, and is unrelated to the order, importance, or relationship between the constituent elements. For example, an embodiment including only a second component but lacking a first component is also feasible.

Singular expressions used herein include plurals expressions unless the context clearly dictates otherwise.

Figure 1:
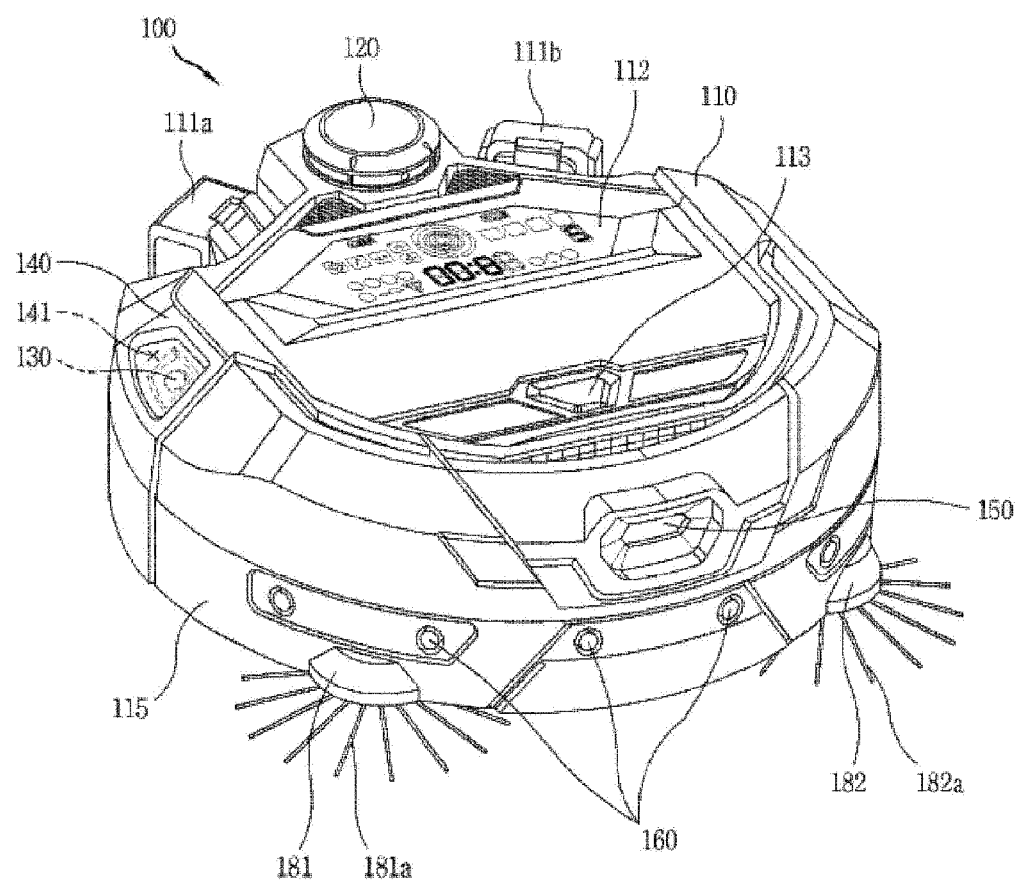
FIG. 1 is a perspective view of a mobile robot according to an embodiment of the present disclosure.
Figure 2:
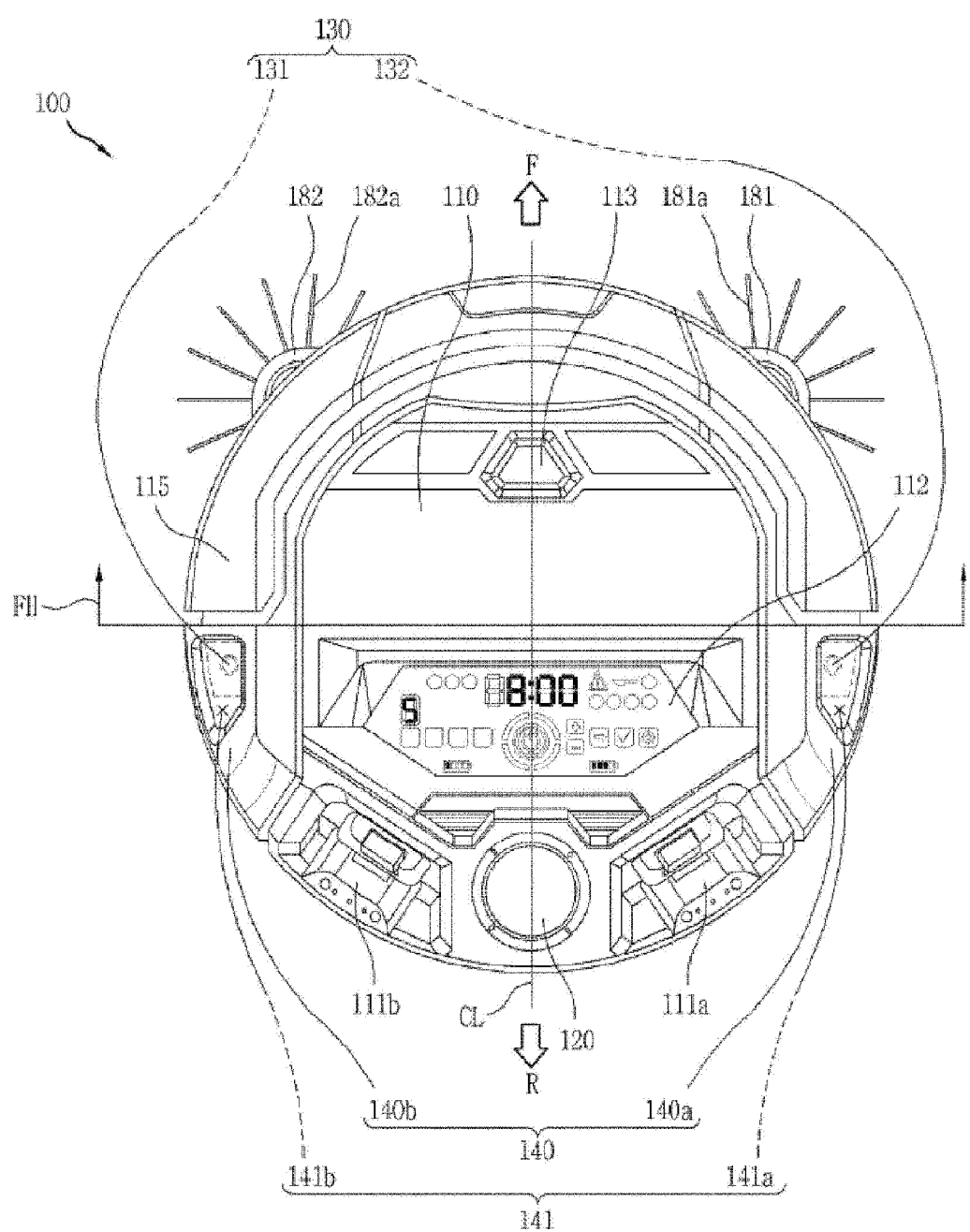
FIG. 2 is a plan view of the mobile robot illustrated in FIG. 1.
Figure 3:
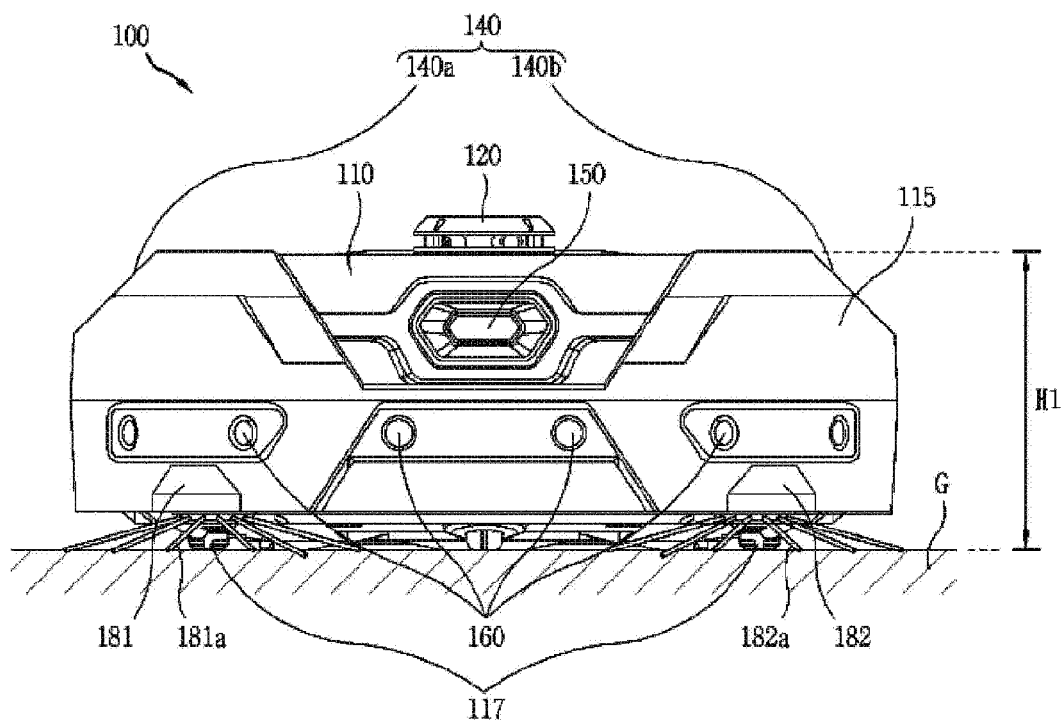
FIG. 3 is a front view of the mobile robot illustrated in FIG. 1.

FIG. 1 is a perspective view of a mobile robot 100 according to an embodiment of the present disclosure. FIG. 2 is a plan view of the mobile robot 100 illustrated in FIG. 1. FIG. 3 is a front view of the mobile robot 100 illustrated in FIG. 1.

Referring to FIGS. 1 to 3, the mobile robot 100 recognizes its surrounding environment while autonomously driving in a certain area and performs a cleaning function appropriate for the environment.

The cleaning function referred to here includes the function of suctioning and removing dust or foreign substances present in a floor area. Additionally, the mobile robot 100 may be used in various environments such as warehouses, homes, and offices.

The mobile robot 100 includes a cleaner body 110, a sensing unit 130, and a bumper 115.

The cleaner body 110 may include a control unit 10 for controlling autonomous driving (or autonomous traveling) of the mobile robot 100. In addition, the cleaner body 110 may include a wheel unit 117 for traveling of the mobile robot 100. The mobile robot 100 may be moved by the wheel unit 117.

The wheel unit 117 may be disposed on a lower portion of the cleaner body 110 to come in contact with the ground G and may be rotatable centering on a shaft perpendicular to the cleaner body 110 for switching a moving direction of the mobile robot 100. The wheel unit 117 may be provided in plurality on the cleaner body 110 to be driven independently.

A battery 111 supplying power for driving the mobile robot 100 may be installed in the cleaner body 110. The battery 11 may include a first battery 111a and a second battery 111b. The first and second batteries 111a and 111b may be detachable from the cleaner body 110 to be recharged separately, or may be recharged while being mounted to the cleaner body 110.

In addition, a display 112 may be disposed on an upper surface of the cleaner body 110 to display various status information related to the operation of the mobile robot 100 and provide the same to a user. The status information may include various pieces of information, such as a power-on/off state, a cleaning state, a cleaning mode, an operation time, and whether or not there is a failure. The cleaning mode may include a mode for cleaning a space, such as a warehouse or a long hallway, without many obstacles along a predetermined pattern, and a mode for cleaning a space, such as an office, with many obstacles without following a predetermined pattern.

In addition, a lamp 113 that displays the state of the robot cleaner 110 in another form together with the display 112 may be disposed on the upper surface of the cleaner body 110.

The lamp 113 may be configured to emit light of various colors in various ways.

For example, the lamp 113 may display light by differentiating colors, brightness of light, flickering shape, and the like. Accordingly, even in a situation in which it is difficult for a user to check the status information of the mobile robot 100 through the display 112, the user may obtain the status information of the mobile robot 100 more intuitively through light emitted from the lamp 113. In addition, in the present disclosure, a case in which one lamp 113 is provided has been described as an example, but the lamp 113 may alternatively be provided in plurality disposed adjacent to each other.

The sensing unit 130 may be disposed at an upper edge (corner) portion of the cleaner body 110 to be inclined with respect to each of a side surface and an upper surface of the cleaner body 110, to capture a side direction and an upper direction of the cleaner body 110. For example, the sensing unit 130 may be implemented as a typical capturing camera. In addition, the sensing unit 130 may be disposed at the rear of the bumper 115 as illustrated in FIG. 2.

Figure 4:
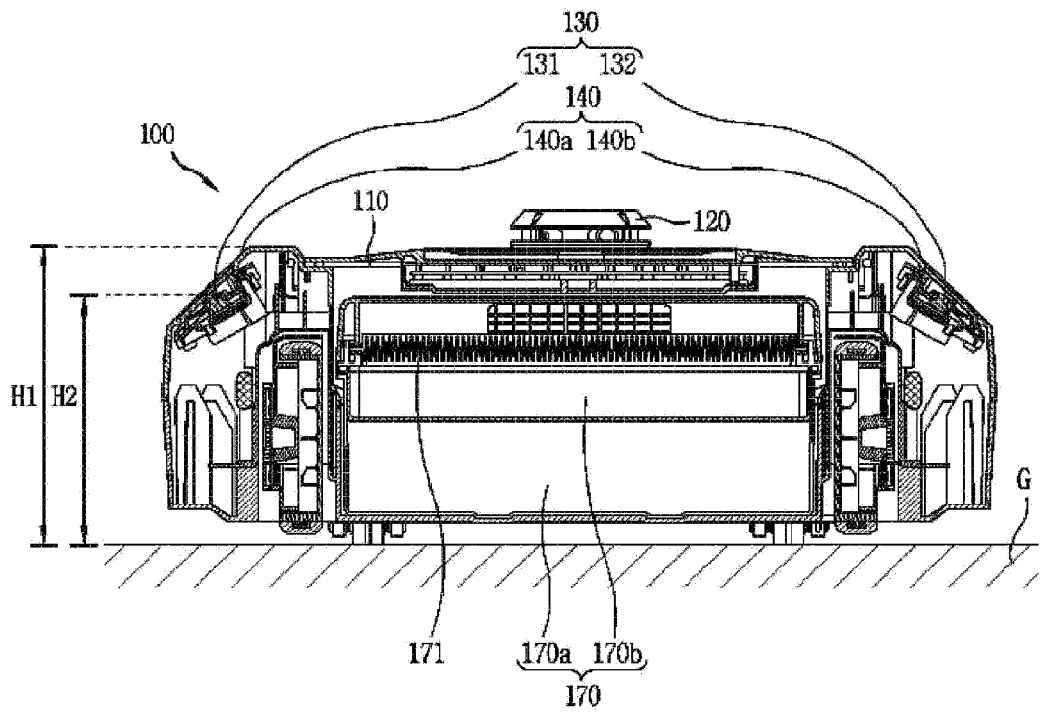
FIG. 4 is a cross-sectional view of the mobile robot illustrated in FIG. 3.

In addition, the sensing unit 130 may have an inclination in the range of 25° to 35° with respect to the ground. On the other hand, the sensing unit 130 may be disposed at a first height H1, at which the bumper 115 is located, from the lower surface of the cleaner body 110, or at a second height H2 lower than the first height H1. For example, the sensing unit 130, as illustrated in FIGS. 3 and 4, may be disposed at the second height H2 that is lower than and close to the first height H1 at which the bumper 115 is located.

According to this structure, the bumper 115 may surround the front surface of the cleaner body 110 so as to expand a range of protecting the mobile robot 100 from obstacles, while expecting to improve an obstacle detection function using a detection function of the bumper 115 itself.

In addition, by arranging the sensing unit 130 at the highest position within the range of the first height H1, reliability of an image sampling operation through the sensing unit 130 may be enhanced. In addition, since the sensing unit 130 is located within the range of the first height H1, the sensing unit 130 may be more safely protected from an impact caused by a collision.

The mobile robot 100 may have appearance in a cylindrical shape, and include an inclined part 140 formed between an upper surface and a side surface of the cleaner body 110 to be described later, so as to be prevented from being jammed due to an obstacle located at an upper side of the mobile robot 100. Here, the bumper 115 may be formed to be inclined along the inclined part 140 to prevent the mobile robot 100 from being jammed due to an obstacle.

According to the configuration of the sensing unit 130 as described above, a new form factor for the camera configuration of the mobile robot 100 may be provided, and a capturing area for the surrounding environment of the cleaner body 110 may be further expanded. In addition, image information related to a side direction (side portion, side area) with respect to a traveling direction of the mobile robot 100 and an upper area of the side portion (side area) may be acquired more effectively. This may facilitate a sampling operation of the image information even in a narrow and long hallway structure such as an office or in a cleaning environment with a high ceiling.

The bumper 115 may be disposed to cover at least part of a first half (FH) area of the cleaner body 110. The first half (FH) means a front half of the whole divided in two. For example, as illustrated in FIG. 2, the bumper 115 may be disposed to cover at least part of a side surface and an upper surface of the cleaner body 110 in the first half (FH) area of the cleaner body 110.

The bumper 115 may have a structure in which one surface of the bumper 115 is made of an elastically deformable material to absorb an impact caused when the mobile robot 100 collides with an obstacle during traveling or that is restored to an original state after pressed due to the collision. Accordingly, the mobile robot 100 may have more improved durability by virtue of absorbing an impact caused by a collision with an obstacle during traveling. In addition, the bumper 115 may detect an impact caused due to collision with an obstacle.

Herein, the sensing unit 130 may be disposed behind the bumper 115. For example, the sensing unit 130 may be disposed at a position adjacent to the bumper 115 in a rear area of the bumper 115 excluding a portion where the bumper 115 is formed on the cleaner body 110.

The mobile robot 100 may further include an ultrasonic sensing unit 160.

The ultrasonic sensing unit 160 may be disposed on one surface of a front side of the bumper 115, to detect a distance from an obstacle and a direction in which the obstacle is located by transmitting ultrasonic waves to the front of the cleaner body 110 and receiving reflected ultrasonic waves. On the other hand, the ultrasonic sensing unit 160 may be disposed to be lower than the sensing unit 130 in an up-and-down direction of the cleaner body 110.

In addition, a front camera 150 may be disposed on a front side of the robot cleaner to face the front of the mobile robot 100, so as to capture the front side of the mobile robot 100. On the other hand, the front of the mobile robot 100 means a side that the cleaner body 110 travels forward (F), namely, the front side of the cleaner body 110, and the rear [opposite (rearward R) to forward (F)] of the mobile robot 100 means the rear side of the cleaner body 110.

In addition, a first side brush 181 and a second side brush 182 may be provided on both sides of a lower portion of the cleaner body 110, respectively. The first and second side brushes 181 and 182 may be configured to be rotatable centering on an axis perpendicular to the mobile robot 100, and perform a function of sweeping foreign substances present on the ground G of an outer area of the mobile robot 100 into a suction device of the mobile robot 100. A plurality of first brushes 181 $a$ and second brushes 182 $a$ may be disposed respectively on outer circumferential surfaces of the first and second side brushes 181 and 182 to separate the foreign substances from the ground G.

The mobile robot 100 may further include an upper sensing unit 120.

The upper sensing unit 120 may protrude from the upper surface of the cleaner body 110 by a predetermined height. The upper sensing unit 120 may irradiate a laser to the surrounding of the cleaner body 110 to detect an obstacle such as a wall located around the cleaner body 110 in a traveling state or a stopped state of the mobile robot 100.

For example, the upper sensing unit 120 may be configured as a LiDAR. The LiDAR is a device that measures a distance to a target object at the surrounding by emitting a pulsed laser (laser-pulsed) and receiving reflected light from the target object, so as to accurately draw out the surrounding.

The mobile robot 100 may further include an inclined part 140.

The inclined part 140 may be formed at an upper edge portion of the cleaner body 110 to be inclined downward with respect to the upper surface of the cleaner body 110, and include a through portion 141 for capturing of the sensing unit 130. Here, the sensing unit 130 may be disposed inside the inclined part 140, to capture a surrounding area of the cleaner body 110 through a through area of the through portion 141.

Hereinafter, the characteristics of the sensing unit 130 and the inclined part 140 will be described with reference to FIGS. 4 and 5 along with FIGS. 1 to 3.

Figure 5:
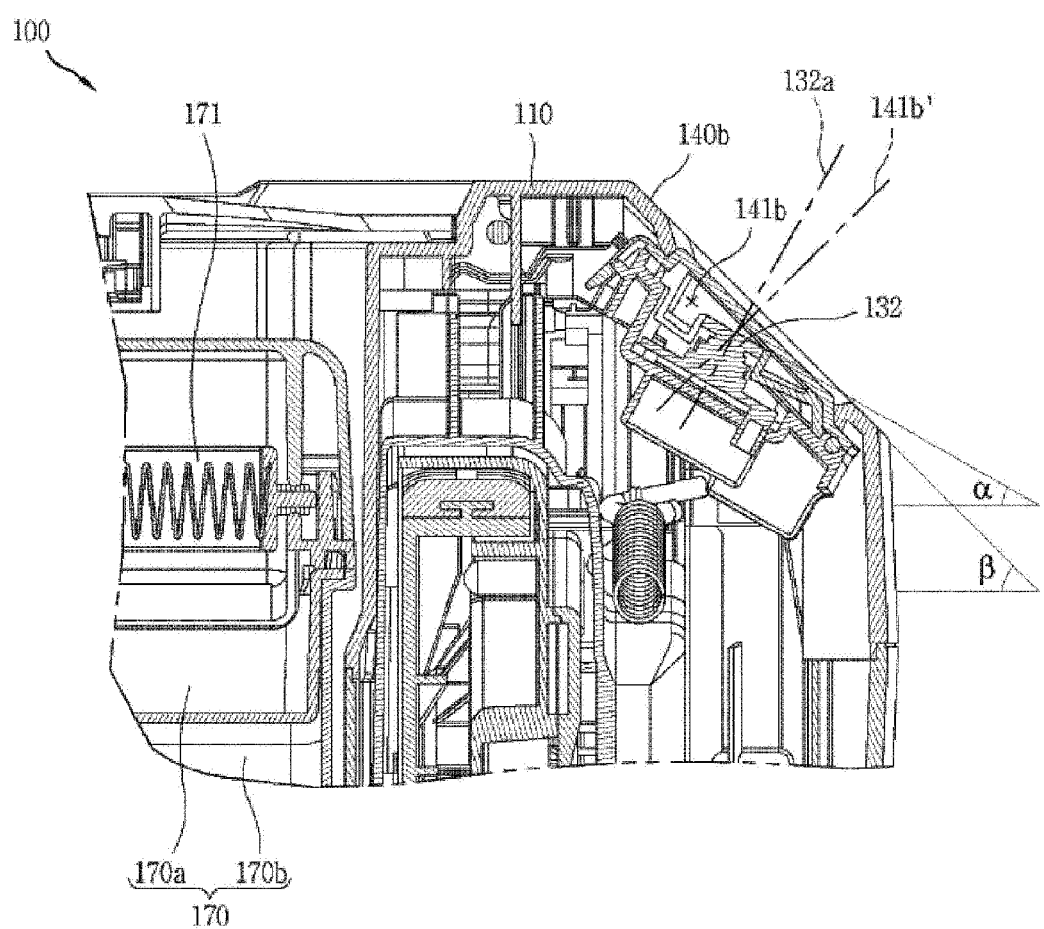
FIG. 5 is an enlarged cross-sectional view centered on a sensing unit of a robot cleaner illustrated in FIG. 4.

FIG. 4 is a cross-sectional view of the mobile robot 100 illustrated in FIG. 3, and FIG. 5 is an enlarged cross-sectional view illustrating the sensing unit 130 in the mobile robot 100 illustrated in FIG. 4.

As illustrated in FIGS. 1 to 5, the sensing unit 130 may include a first camera part 131 and a second camera part 132.

As illustrated in FIG. 4, a dust box 170 for accommodating foreign substances collected into the cleaner body 110 through the suction device of the mobile robot 100 may be disposed in the cleaner body 110. In addition, the dust box 170 may include a first accommodating portion 170 $a$ and a second accommodating portion 170 $b$ that are partitioned to collect foreign substances having relatively large particles and foreign substances having relatively small particles, respectively.

In addition, a dust filter 171 for filtering foreign substances or dust in air discharged to the outside of the dust box 170 may be mounted to an upper portion of the dust box 170.

The first camera part 131 and the second camera part 132 may be disposed in one side and another side of an upper edge area of the cleaner body 110, respectively, in an inclined manner, so as to capture the side direction and the upper direction of the cleaner body 110. The first camera part 131 and the second camera part 132, as illustrated in FIG. 2, may be disposed at symmetrical positions in a left and right direction based on a front center line CL of the cleaner body 110.

Accordingly, the surrounding environment of the cleaner body 110 including a wider area may be captured through the first and second camera parts 131 and 132, and thus an amount of information obtained from images captured through the first and second camera parts 131 and 132 may be more increased.

The inclined part 140 may include a first inclined surface 140 $a$ and a second inclined surface 140 $b$ formed on one side and another side of the cleaner body 110 to correspond to the configuration of the first and second camera parts 131 and 132. In addition, to correspond to the first inclined surface 140 $a$ and the second inclined surface 140 $b$, the through portion 141 may include a first through hole 141 $a$ and a second through hole 141 $b$ through which the first camera part 131 and the second camera part 132 capture images, respectively.

In addition, the control unit 10 may be configured to detect a current position of the mobile robot 100 in a traveling area by using the images captured through the first and second camera parts 131 and 132. The position of the mobile robot 100 may be detected based on map information which is created by performing a SLAM task using image information acquired through the first and second cameras 131 and 132.

Herein, an inclination of the sensing unit 130 may be set to be smaller than that of the inclined part 140, such that an optical axis of the sensing unit 130 is directed more upward than a central axis of the through portion 141. The characteristics of the sensing unit 130 and the inclined part 140 will be exemplarily described based on the second camera part 132 and the second inclined surface 140$b$, with reference to FIG. 5. An inclination a of the second camera part 132 may be smaller than an inclination B of the second inclined surface 140$b$, such that an optical axis 132$a$ of the second camera part 132, namely, a reference line for a direction and position of a light beam when examining the progress of the light beam in an optical system, may be directed upward of the mobile robot 100 rather than a central axis 141$b'$ of the second through hole 141$b$. For example, when the inclination B of the second inclined surface 140$b$ is 45°, the inclination a of the second camera part 132 may be 30°.

Figure 6:
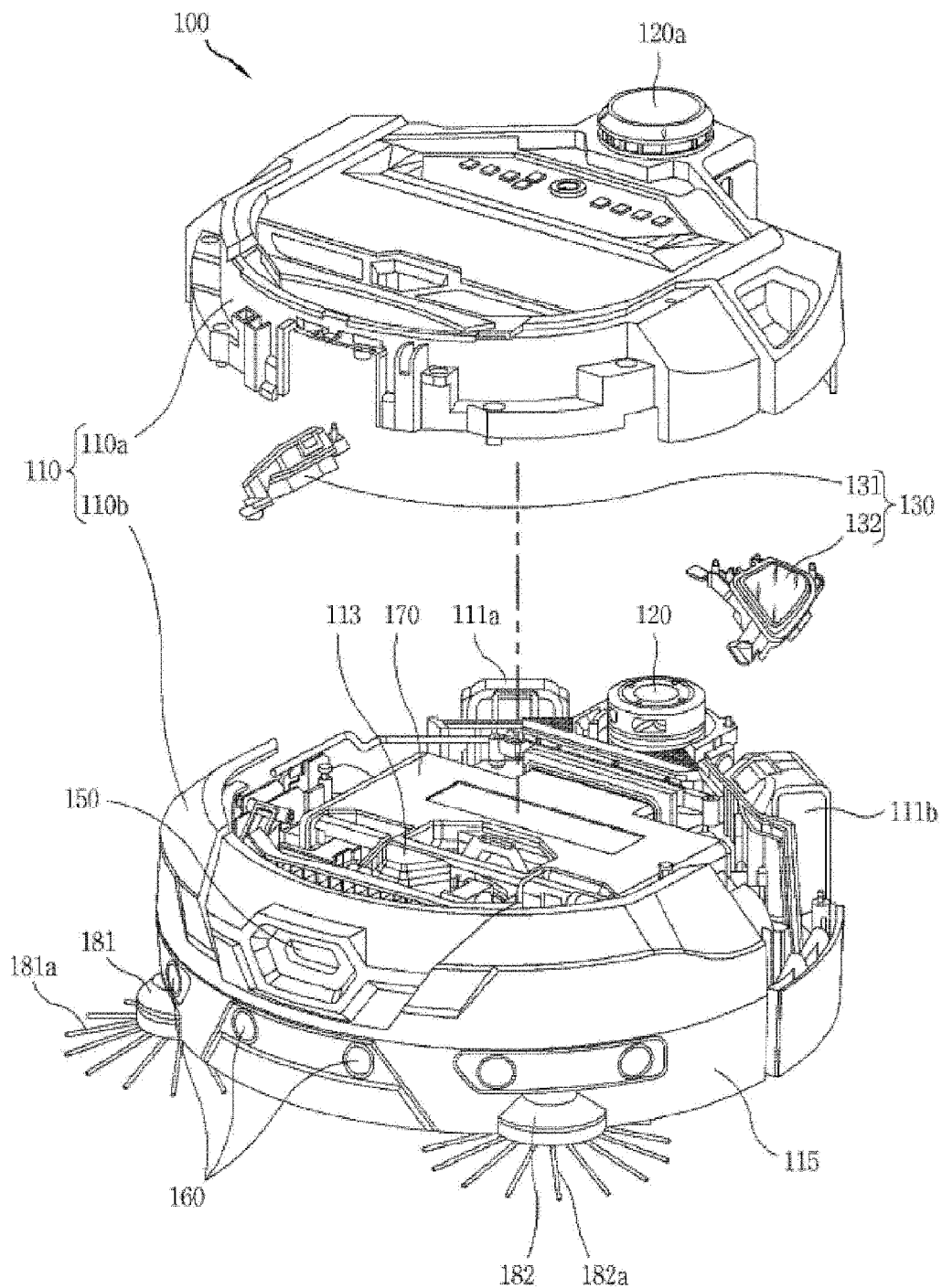
FIG. 6 is an exploded perspective view of the robot cleaner illustrated in FIG. 1.

FIG. 6 is an exploded perspective view of the mobile robot 100 illustrated in FIG. 1.

As illustrated in FIG. 6, the cleaner body 110 may include an upper case 110a and a lower case 110b. The upper case 110a and the lower case 110b may be coupled to define an inner space for accommodating various parts provided for driving the mobile robot 100.

The battery 111 supplies power to the sensing unit 130, an input unit 16, an output unit 17, the control unit 10, a first side brush 181, and a second side brush 182.

Figure 7:
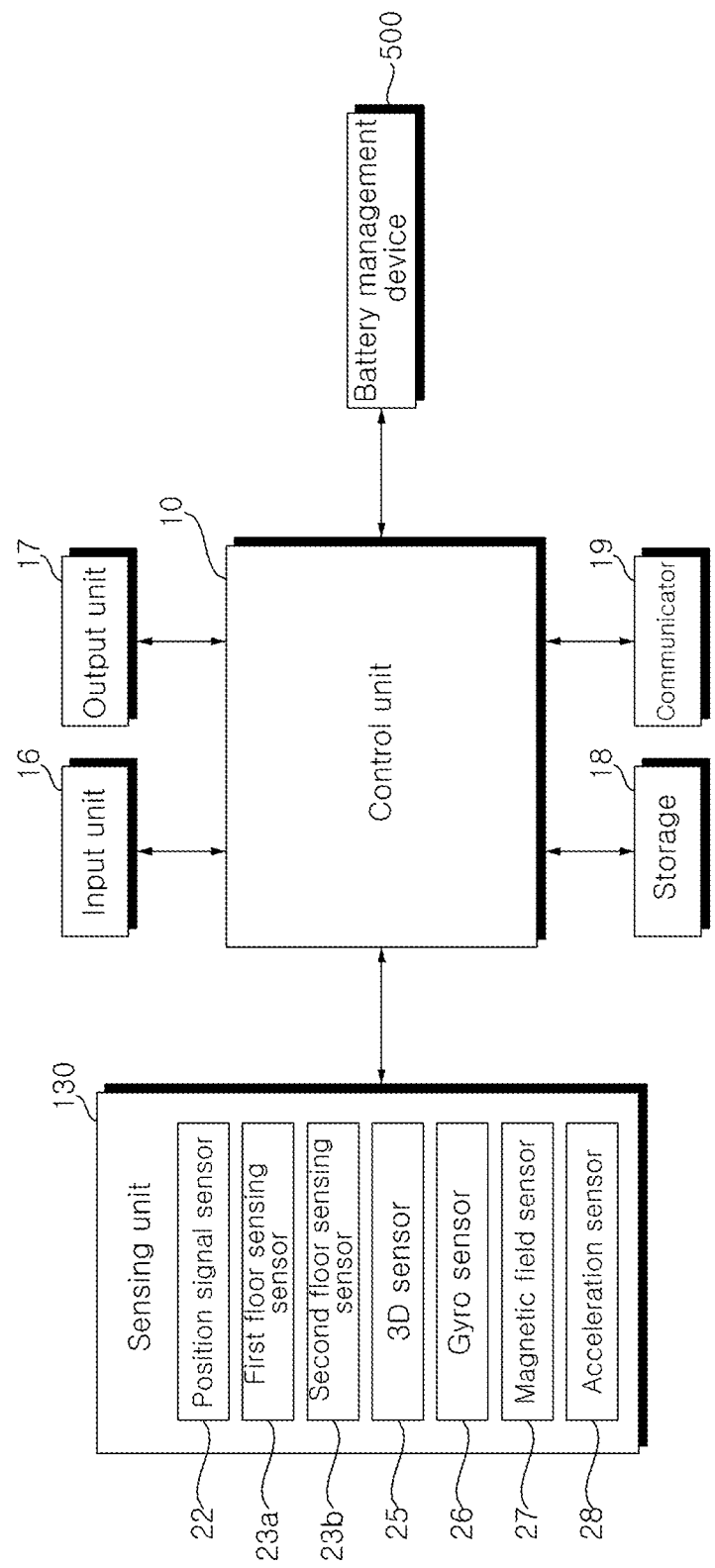
FIG. 7 is a control block diagram illustrating the mobile robot according to an embodiment of the present disclosure.

Referring to FIG. 7, the battery includes the sensing unit 130 that senses various pieces of information related to the operation or state of the mobile robot 100 or external situations.

The sensing unit 130 may include an obstacle sensor 21 for sensing an external obstacle which is spaced apart from the mobile 100. A plurality of obstacle sensors 21 may be provided. The obstacle sensor 21 includes the obstacle sensors for sensing front obstacles. The obstacle sensor 21 may include an infrared sensor, an ultrasonic sensor, an RF sensor, a geomagnetic sensor, a Position Sensitive Device (PSD) sensor, and the like.

The sensing unit 130 may include a position signal sensor 22 for determining a position by receiving an identification signal from an external source. For example, the position signal sensor 22 may be an Ultra-Wide Band (UWB) sensor using an Ultra-Wide Band (UWB) signal. The control unit 10 may identify the position of the mobile robot 100 based on the signal received by the position signal sensor 22.

The external identification signal is a signal transmitted by an external signal generator, such as a beacon located at an external position and the like. A plurality of signal generators may be provided at positions which are spaced apart from each other. Accordingly, the position signal sensor 22 may receive identification signals transmitted from signal generators positioned at different places.

The sensing unit 130 may include a first floor sensing sensor 23a for sensing the presence of a cliff on the floor. The first floor sensing sensor 23a may sense the presence of a cliff at the front and/or rear of the mobile robot 100. The first floor sensing sensor 23a senses a distance from the floor; and when the distance from the floor is greater than a predetermined distance, the control unit determines that there is a cliff, and may control the mobile robot 100 to perform a motion in response to the cliff.

For example, the first floor sensing sensor 23a may include an optical sensor, and the optical sensor may include a laser sensor or an infrared sensor. The first floor sensing sensor 23a may include a light emitter (not shown) for emitting light onto the floor, and a light receiver (not shown) for receiving light reflected from the floor. The first floor sensing sensor 23a may measure the distance based on a time difference between the emitted light and the light returning to the light receiver.

Further, the first floor sensing sensor 23a may sense reflectance of light reflected from the floor. Specifically, by measuring an amount, illuminance, and the like of the returning light, the light receiver may obtain reflectance of the returning light compared to the light emitted by the light emitter. By sensing reflectance of light reflected from the floor, the first floor sensing sensor 23a may provide the control unit with a member for detecting a material of the floor.

The sensing unit 130 may include a second floor sensing sensor 23b which detects an amount of movement of the mobile robot based on a floor image. The second floor sensing sensor 23b may sense reflectance of light reflected from the floor. In addition, the second floor sensing sensor 23b may detect the reflectivity (roughness) of the floor from image quality information.

For example, the second floor sensing sensor 23b may include an optical flow sensor. The optical flow sensor converts a downward image input from an image sensor provided within the sensor to generate image data in a predetermined format. The generated image data may be transmitted to the control unit.

In addition, at least one light source may be installed adjacent to the optical flow sensor. The at least one light source emits light to a predetermined area of the floor surface, which is captured by the image sensor. In other words, while the mobile robot moves in a specific area along the floor surface, a predetermined distance is maintained between the image sensor and the floor surface when the floor surface is flat.

In contrast, when the mobile robot moves on an uneven floor surface, the image sensor and the floor surface are spaced apart from each other by a predetermined distance or more due to an unevenness and an obstacle on the floor surface. In this case, the at least one light source may be controlled by the control unit to adjust an amount of light to be emitted. The light source may be a light emitting device, for example, a light emitting diode (LED), which is capable of adjusting an amount of light.

By using the optical flow sensor, the control unit may detect a position of the mobile robot regardless of sliding of the mobile robot. By comparing and analyzing image data captured by the optical flow sensor according to elapsed time, the control unit may calculate a moving distance and a moving direction, and may calculate a position of the mobile robot based on the calculated moving distance and moving direction. By using downward image information of the mobile robot which is captured using the optical flow sensor, the control unit may perform correction resistant to sliding with respect to the position of the mobile robot calculated by other ways.

The second floor sensing sensor 23b may provide the control unit with a member for detecting a material of the floor by sensing reflectance of light reflected from the floor or by analyzing an image of the floor.

In addition, the first floor sensing sensor 23a and the second floor sensing sensor 23b may perform the function of sensing the cliff and the amount of movement of the mobile robot, and at the same time, may also perform the function of determining the material of the floor.

The sensing unit 130 may include a camera 24 for sensing an external image. The camera 24 may be disposed at the body 110, and may sense an upward image of the body 30.

The sensing unit 130 may include a 3D sensor 25 for sensing three-dimensional (3D) position information of an external environment.

For example, the 3D sensor 135 may include: a light emitter (not shown) for emitting infrared light; and a 3D camera (3D Depth Camera, not shown) for sensing the infrared light reflected from an external object. The light emitter may also emit infrared light having a predetermined pattern. The 3D camera may be an IR camera, an RGB-Depth camera, and the like. Such 3D sensor 135 may be implemented using a time-of-flight (TOF) scheme.

In another example, the 3D sensor 25 may be implemented by using stereo vision techniques, in which 3D coordinate information is generated by combining two or more images acquired using two or more cameras.

The sensing unit 130 may include a slope information obtainer (not shown) for obtaining slope information on a floor (H) of the body 110. For example, the slope information obtainer may include a gyro sensor 26. The slope information obtainer may include a processing module (not shown) for converting a sensing signal of the gyro sensor 26 into slope information. The processing module, which is provided as part of the control unit 10, may be implemented using an algorithm or a program. In another example, the slope information obtainer may include a magnetic field sensor 27, and may obtain slope information based on sensing information on the magnetic field of the earth.

Here, the floor refers to a horizontal plane, and a plane which is perpendicular to the direction of gravity. The gyro sensor 26 may obtain information on a rotating angular speed with respect to a horizontal plane of the body 110. Specifically, the gyro sensor 26 may sense a rotating angular speed around the X-axis and the Y-axis which are parallel to the horizontal plane and mutually cross at right angles. The rotating angular speed in a horizontal plane may be calculated by synthesizing a rotating angular speed (roll) around the X-axis and a rotating angular speed (pitch) around the Y-axis using the processing module. A slope value may be calculated by integrating the rotating angular speed using the processing module.

The gyro sensor 26 may sense a determined reference direction. The slope information obtainer may obtain slope information based on the reference direction.

The gyro sensor 26 may have a gyro sensing function for three axes in a space coordinate system which mutually cross at right angles. Information collected by the gyro sensor 26 may include roll, pitch and yaw information. The processing module may calculate a direction angle of the mobile robot 100 by integrating roll, pitch and yaw angular speeds.

The gyro sensor 26 is preferably disposed at the body 110. Accordingly, the gyro sensor 26 is disposed in a remaining part Q, which will be described later, and in which the body 30 is included. Further, the slope information obtainer is disposed in the remaining part Q.

The gyro sensor 26 may be implemented as a separate sensor, or may function as part of an IMU sensor which will be described later.

The sensing unit 130 may include the magnetic field sensor 27 for sensing the magnetic field. The magnetic field sensor 27 may have a magnetic field sensing function for three axes in a space coordinate system which mutually cross at right angles. The magnetic field sensor 27 may measure a direction angle (azimuth). The magnetic field sensor 27 may be implemented as a separate sensor, or may function as part of an IMU sensor which will be described later.

The sensing unit 130 may include an acceleration sensor 28 for sensing the acceleration of the mobile robot 100. The acceleration sensor 28 may provide an acceleration sensing function for three axes in a space coordinate system which mutually cross at right angles. The acceleration sensor 28 may be implemented as a separate sensor, or may function as part of an IMU sensor which will be described later.

The mobile robot 100 may include an inertial sensor unit (IMU, not shown). Based on information of the inertial sensor unit, the mobile robot 100 may stabilize traveling motions of the mobile robot 100. The IMU may function as the gyro sensor 26, the magnetic field sensor 27, and the acceleration sensor 28.

The sensing unit 130 may include an encoder (not shown) which recognizes an actual moving path of the mobile robot 100.

The mobile robot 100 includes the input unit 16 which inputs a user's various instructions. The input unit 16 may include a button, a dial, a touch-type display, and the like. The input unit 16 may include a microphone (not shown) for voice recognition, and a power switch 16a for switching ON and OFF the power supply.

The mobile robot 100 includes the output unit 17 for outputting a variety of information to a user. The output unit 17 may include the display 112 for outputting visual information, and a speaker (not shown) for outputting auditory information.

The mobile robot 100 includes a storage 18 for storing various pieces of information. The storage 18 may include a volatile or non-volatile recording medium. The storage 18 may store algorithms for controlling various motions of the mobile robot 100 in response to errors.

The storage 18 may include a map of a traveling area. The map may be input by an external terminal which may exchange information through a communicator 19, or the mobile robot 100 may generate the map by learning by itself. In the former case, examples of the external terminal may include a remote control, a PDA, a laptop computer, a smartphone, a tablet PC, and the like, in which an application for setting up the map is installed.

The mobile robot 100 may include the communicator 19 which may access a predetermined network. The communicator 19 may be implemented using wireless communication techniques, such as IEEE 802.11 WLAN, IEEE 802.15 WPAN, UWB, Wi-Fi, Zigbee, Z-wave, Blue-Tooth, and the like, according to a communication protocol.

The mobile robot 100 includes the control unit 10 for controlling autonomous traveling. The control unit 10 may be implemented on a main PCB (Co) disposed in the body 110.

The control unit 10 may process a signal of the input unit 16 or a signal input through the communicator 19.

The control unit 10 may control traveling of the mobile robot by receiving a sensing signal of the sensing unit 130.

The control unit 10 may learn a traveling area by using images sensed by the sensing unit 130, and may recognize a current position. The control unit 10 may be configured to map the traveling area through the images, and may recognize the current position on the map. The images captured by the camera 24 may be used to generate the map of the traveling area and to recognize the current position in the traveling area. For example, the control unit 10 may generate the map of the traveling area by using an image of a boundary between a ceiling and a side surface, among upward images captured by the camera 24. Further, the control unit 10 may sense the current position in the traveling area based on feature points of the images.

The control unit 10 may control the mobile robot 100 to return to a charging station after traveling.

For example, the mobile robot 100 may be configured to return to the charging station by sensing an infrared (IR) signal and the like transmitted from the charging station. The control unit 10 may control the mobile robot 100 to return to the charging station based on the sensed signal which is transmitted from the charging station. The charging station may include a signal transmitter (not shown) which transmits a predetermined returning signal.

In another example, by recognizing the current position on the map, the control unit 10 may control the mobile robot 100 to return to the charging station. The control unit 10 may recognize a position, corresponding to the charging station, and the current position on the map, and the mobile robot 100 may return to the charging station based on the positions.

The control unit 10 may control the mobile robot 100 based on information input through a user's terminal (for example, smartphone, computer, etc.). The mobile robot 100 may receive the input information through the communicator 19. Based on the input information, the control unit 10 may control a traveling pattern (for example, traveling in a zigzag path or traveling for intensively cleaning a certain area). Based on the input information, the control unit 10 may control whether to activate a specific function (for example, finding lost articles, repelling insects, etc.) of the mobile robot 100. Further, based on the input information, the control unit 10 may set a start time of a cleaning traveling mode of the mobile robot 100 to a specific time (cleaning reservation function).

The control unit 10 may control a battery management device 500. As another example, the battery management device 500 may be controlled by a battery controller 560, or may be controlled by the battery controller 560 and the control unit 10.

The battery management device 500 efficiently supplies power to the mobile robot using a plurality of batteries 111 and reduces power consumption of the unused batteries 111 while checking the remaining amount of the unused batteries 111.

Hereinafter, the battery management device 500 according to an embodiment of the present disclosure will be described in detail.

Figure 8A:
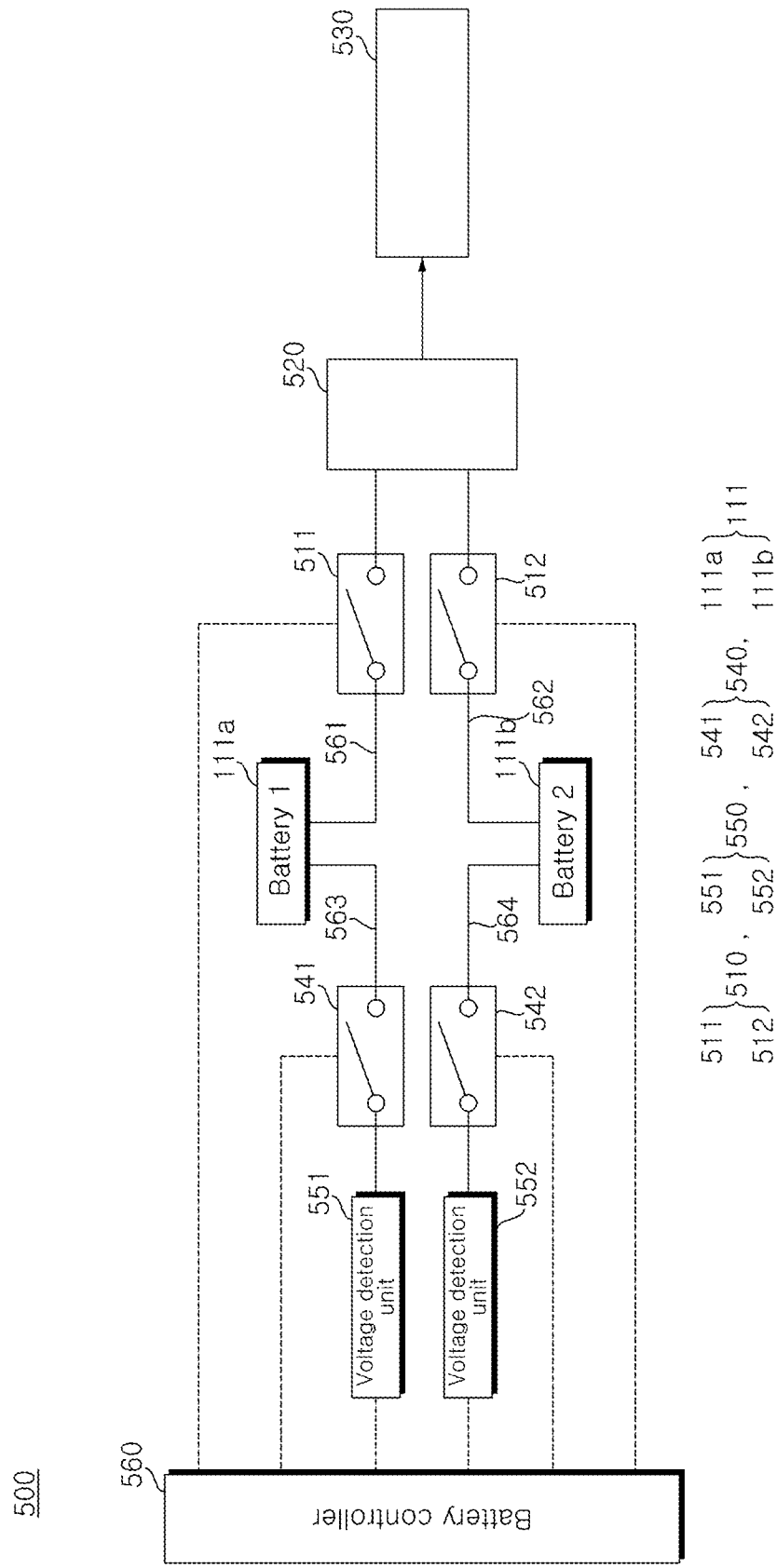
FIG. 8A is a diagram illustrating a battery management device according to an embodiment of the present disclosure.

Referring to FIG. 8A, the battery management device 500 according to an embodiment of the present disclosure includes: a power supply unit 520 which generates an operating power supply voltage from a plurality of batteries 111; a power connection switching unit 510 which performs connection or disconnection of the power supply unit 520 to or from each of the batteries 111; a plurality of voltage detection units 550 which detect output voltages output from the respective batteries 111; a detection connection switching unit 540 which performs connection or disconnection of each of the batteries 111 to or from each of the voltage detection units 550; and a battery controller 560 which controls the power connection switching unit 510 and the detection connection switching unit 540 based on information input from the voltage detection units 550.

Although this embodiment is described as using two batteries 111, it is not limited thereto.

The power supply unit 520 generates an operating power voltage used by the mobile robot through the output voltage from at least one of the plurality of batteries 111. The power supply unit 520 may be electrically connected to a demand source 530.

The power supply unit 520 is electrically connected to the first battery 111a and a first line 561. The power supply unit 520 is electrically connected to the second battery 111b and a second line 562.

The power connection switching unit 510 performs connection and disconnection between the power supply unit 520 and each battery 111. The power connection switching unit 510 is controlled by the battery controller 560.

The power connection switching unit 510 includes a first power connection switching unit 511 and a second power connection switching unit 512.

The first power connection switching unit 511 connects and disconnects between the power supply unit 520 and the first battery 111a. Specifically, the first power connection switching unit 511 may include a switch disposed on the first line 561. The first power connection switching unit 511 electrically connects the power supply unit 520 and the first battery 111a through the first line 561 in an close state, and the first power connection switching unit 511 electrically disconnects the power supply unit 520 and the first battery 111a in a opened state.

The second power connection switching unit 512 connects and disconnects between the power supply unit 520 and the second battery 111b. Specifically, the second power connection switching unit 512 may include a switch disposed on the second line 562. The second power connection switching unit 512 electrically connects the power supply unit 520 and the second battery 111b through the second line 562 in an open state, and the second power connection switching unit 512 electrically disconnects the power supply unit 520 and the second battery 111b in a closed state.

The plurality of voltage detection units 550 detects the output voltage output from each battery 111 and provides the same to the battery controller 560 and/or the storage 18. The voltage detection unit 550 may use known technologies. For example, the voltage detection unit 550 may include a first voltage detection unit 551 that detects the output voltage of the first battery 111a, and a second voltage detection unit 552 that detects the output voltage of the second battery 111b.

The detection connection switching unit 540 performs connection and disconnection between each battery 111 and each voltage detection unit 550. The detection connection switching unit 540 is controlled by the battery controller 560.

The detection connection switching unit 540 includes a first detection connection switching unit 541 and a second detection connection switching unit 542. The first voltage detection unit 551 is electrically connected to the first battery 111a and a third line 563. The second voltage detection unit 552 is electrically connected to the second battery 111b and a fourth line 564.

The first detection connection switching unit 541 connects and disconnects between the first voltage detection unit 551 and the first battery 111a. Specifically, the first detection connection switching unit 541 may include a switch disposed on the third line 563. The first detection connection switching unit 541 electrically connects the first voltage detection unit 551 and the first battery 111a through the third line 563 in an open state, and the first detection connection switching unit 541 electrically disconnects the first voltage detection unit 551 and the first battery 111a in a closed state.

The second detection connection switching unit 542 connects and disconnects between the second voltage detection unit 552 and the second battery 111b. Specifically, the second detection connection switching unit 542 may include a switch disposed on the fourth line 564. The second detection connection switching unit 542 electrically connects the second voltage detection unit 552 and the second battery 111b through the fourth line 564 in an open state, and the second detection connection switching unit 542 electrically disconnects the second voltage detection unit 552 and the second battery 111b in a closed state.

The battery controller 560 may control the power connection switching unit 510 and the detection connection switching unit 540 based on information input from the voltage detection unit 550. As described above, depending on the embodiment, the battery controller 560 may be omitted and the control unit 10 may function as the battery controller 560.

The battery controller 560 may select one of the plurality of batteries 111 as the main battery and select the remaining battery 111 as the auxiliary battery based on the output voltage.

Specifically, the battery controller 560 may compute the initial voltage value of each of the plurality of batteries 111, select the battery with the largest initial voltage value as the main battery, and select the remaining batteries 111 as auxiliary batteries.

The battery controller 560 may connect the main battery and the power supply unit 520 and disconnect the auxiliary battery and the power supply unit 520.

Figure 8B:
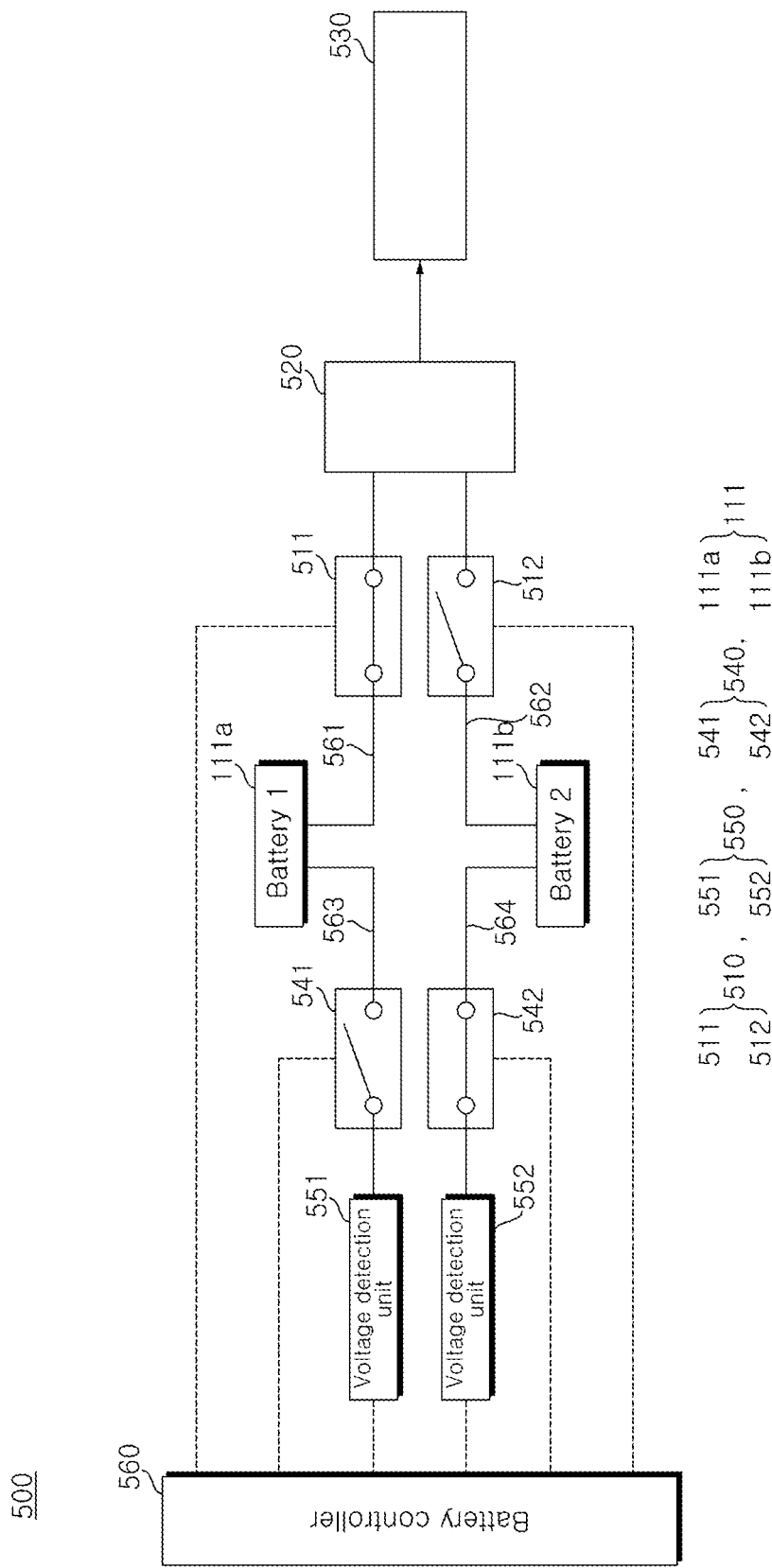
FIG. 8B is a diagram illustrating switching when a main battery and an auxiliary battery are selected in FIG. 8A.

Specifically, referring to FIG. 8B, when the first battery 111*a* is selected as the main battery and the second battery 111*b* is selected as the auxiliary battery, the first power connection switching unit 511 may be in an close state to electrically connect the power supply unit 520 and the first battery 111*a*, and the second power connection switching unit 512 may be in a opened state to electrically disconnect the power unit 520 and the second battery 111*b*.

The initial voltage value of each battery 111 may be computed as the average value of many output voltage values for accurate measurement. For example, the initial voltage value of each battery 111 may be computed as the average value of the output voltages a greater number of times than the remaining voltage value of the auxiliary battery.

Specifically, the initial voltage value of each battery 111 may be the average value of the output voltage values of each battery 111 measured multiple times at an interval of a fourth time period during a third time period. Preferably, the initial voltage value of each battery 111 may be the average value of the output voltage value of each battery 111 measured 30 to 40 times at intervals of 8 to 10 msec for 300 to 400 msec.

By the aforementioned method, the first voltage detection unit computes the initial voltage value of the first battery 111*a*, and the second voltage detection unit computes the initial voltage value of the second battery 111*b*.

After selecting the main battery and the auxiliary battery, the battery controller 560 may periodically measure the remaining voltage value of the auxiliary battery and perform control to reduce power consumption of the auxiliary battery.

The battery controller 560 may periodically perform connection or disconnection between the auxiliary battery and the voltage detection unit 550 to reduce the consumption of the battery 111. In other words, the battery controller 560 may alternately execute a connection state for connecting the auxiliary battery and the voltage detection unit 550 and a disconnection state for disconnecting the auxiliary battery and the voltage detection unit 550.

The battery controller 560 may reduce the consumption of the battery 111 by reducing the number of measurements of the output voltage value of the auxiliary battery and increasing the cycle time between each measurement. The battery controller 560 may reduce the consumption of the battery 111 by reducing the number of measurements of the output voltage value of the auxiliary battery, increasing the cycle time between each measurement, and periodically perform connection or disconnection between the auxiliary battery and the voltage detection unit 550.

For example, the battery controller 560 may connect the auxiliary battery and the voltage detection unit 550 for a first time period T1 and periodically repeat disconnection for a second time period T2. The battery controller 560 may connect the second battery 111*b* and the second voltage detection unit 552 for the first time period T1 and periodically repeat disconnection for the second time period T2.

Specifically, the battery controller 560 may maintain the second power connection switching unit 512 in a closed state for the first time period T1 and maintain the second power connection switching unit 512 in an open state for the second time period T2.

The first time period T1 may be shorter than the second time period T2. The second time period T2 for maintaining the second power connection switching unit 512 in an open state is longer than the first time period T1 for maintaining the second power connection switching unit 512 in a closed (open) state. As a result, power consumption generated when the second battery 111*b* and the second voltage detection unit 552 are electrically connected may be reduced.

The second time period T2 may be 20 to 30 times the first time period T1. Preferably, the first time period T1 may be 15 to 25 msec, and the second time period T2 may be 450 to 550 msec.

Figure 9:
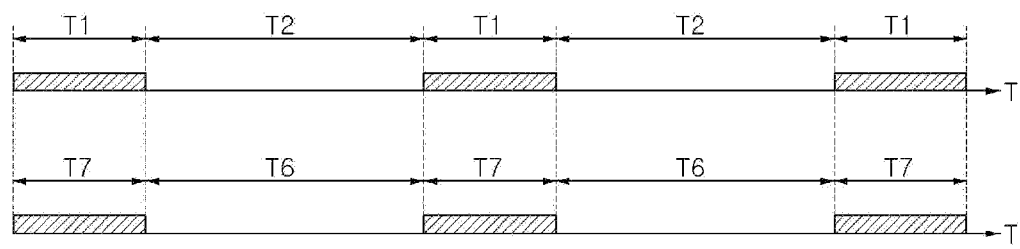
FIG. 9 is a diagram comparing the time to connect and disconnect an auxiliary battery and a voltage detection unit and the time to measure an output voltage of the auxiliary battery.

Referring to FIG. 9, the battery controller 560 may detect the output voltage of the auxiliary battery and calculate the remaining voltage value while the auxiliary battery and the voltage detection unit 550 are connected. The battery controller 560 may detect the output voltage of the auxiliary battery and calculate the remaining voltage value during the first time period T1 when the auxiliary battery and the second power connection switching unit 512 are closed.

Preferably, the battery controller 560 detects the output voltage of the auxiliary battery twice during the first time period T1 when the auxiliary battery and the second power connection switching unit 512 are in a closed state, and the remaining voltage value may be calculated by averaging the two detected auxiliary battery output voltages.

As another example, the battery controller 560 may calculate the remaining voltage value from the output voltage of the auxiliary battery at an interval of a sixth time period T6, and the remaining voltage value may be an average value of the output voltage value of the auxiliary battery measured multiple times at an interval of a fifth time period during a seventh time period T7.

The battery controller 560 may match the cycle of the interval of the sixth time period T6 and the interval of the second time period and match the first time period T1 and the seventh time period T7, so that while the auxiliary battery and the voltage detection unit 550 are connected, the output voltage of the auxiliary battery may be detected and the remaining voltage value may be calculated. Preferably, the first time period T1 may be equal to the seventh time period T7, and the second time period T2 may be equal to the interval of the sixth time period T6.

Here, the sixth time period T6 may be longer than the seventh time period T7. The sixth time period T6 may be longer than the third time period. The third time period may be longer than the seventh time period T7. The interval of the fifth time period may be larger than the interval of the fourth time period. Accordingly, the remaining voltage value of the auxiliary battery may be measured by intermittently measuring the output voltage value of each battery 111 rather than the initial voltage value of each battery 111, thereby reducing power consumption of the auxiliary battery.

The remaining voltage value of the auxiliary battery may be an average value of output voltage values of the auxiliary battery measured multiple times at the interval of the fifth time period during the first time period T1. The number of measurements of the output voltage value of the auxiliary battery measured at the interval of the fifth time period when calculating the remaining voltage value may be less than the number of measurements of the output voltage value of each battery 111 measured at the interval of the fourth time period when calculating the initial voltage value. Accordingly, by increasing the number of measurements of the output voltage value when calculating the maximum voltage value and decreasing the number of measurements of the output voltage value when calculating the remaining voltage value, the accuracy of the initial voltage value may be improved and power consumption may be reduced while slightly sacrificing the accuracy of the remaining voltage value.

When the remaining voltage value is less than the first voltage value, the battery controller 560 may determine that the auxiliary battery has been removed. When the remaining average voltage value is greater than or equal to the first voltage value, the battery controller 560 may determine that the auxiliary battery is installed.

When it is determined that the auxiliary battery has been mounted again, the battery controller 560 may output battery 111 replacement information through the output unit 17 and compute the initial voltage value of the replaced auxiliary battery.

The battery controller 560 may periodically calculate the remaining voltage value from the output voltage of the auxiliary battery. When the remaining average voltage value is less than the first voltage and then becomes greater than or equal to the first voltage, the initial voltage value of the auxiliary battery may be computed. The first voltage may be 2V to 4V.

The computation of the initial voltage value of the auxiliary battery after replacement of the auxiliary battery may be performed in the same manner as the computation of the initial voltage value of the auxiliary battery during computation of the initial voltage value of each battery 111.

The initial voltage value of the auxiliary battery may be the average value of the output voltage values of each battery 111 measured multiple times at the interval of the fourth time period during the third time period. Preferably, the initial voltage value of each battery 111 may be the average value of the output voltage value of each battery 111 measured 30 to 40 times at intervals of 8 to 10 msec for 300 to 400 msec.

The third time period may be shorter than the second time period and longer than the second time period, wherein the second time period may be longer than the fourth time period.

When the auxiliary battery is replaced, the battery controller 560 stores the initial voltage value of the replaced auxiliary battery in the storage 18. When the voltage value of the main battery falls below a certain value, the battery controller 560 may disconnect the main battery and the power supply unit 520 and connect the auxiliary battery and the power supply unit 520.

Hereinafter, methods for controlling the battery management device 500 according to an embodiment of the present disclosure will be described. In each flowchart, the same content is denoted by the same reference numeral, and an overlapped explanation is omitted.

The control method may be performed by the control unit 10 and/or the battery controller 500. The present disclosure may be a control method of the battery management device 500 and may be the mobile robot 100 including the control unit 10 performing the control method. The present disclosure may be a computer program including each stage of the control method, or may be a recording medium on which a program for implementing the control method by a computer is recorded. The term "recording medium" means a computer-readable recording medium. The present disclosure may be a mobile robot control system including both hardware and software.

Each stage of flowcharts of the control method and the combinations of flowcharts may be performed by computer program instructions. The instructions may be installed in a general purpose computer or a special purpose computer, and the instructions may create a way for performing the functions described in the stage(s) of flowchart.

In addition, in some embodiments, it is possible that the functions mentioned in the stages may be generated out of sequence. For example, the two stages shown in succession may be performed substantially simultaneously, or, sometimes, the stages may be performed in reverse order according to a corresponding function.

Figure 10:
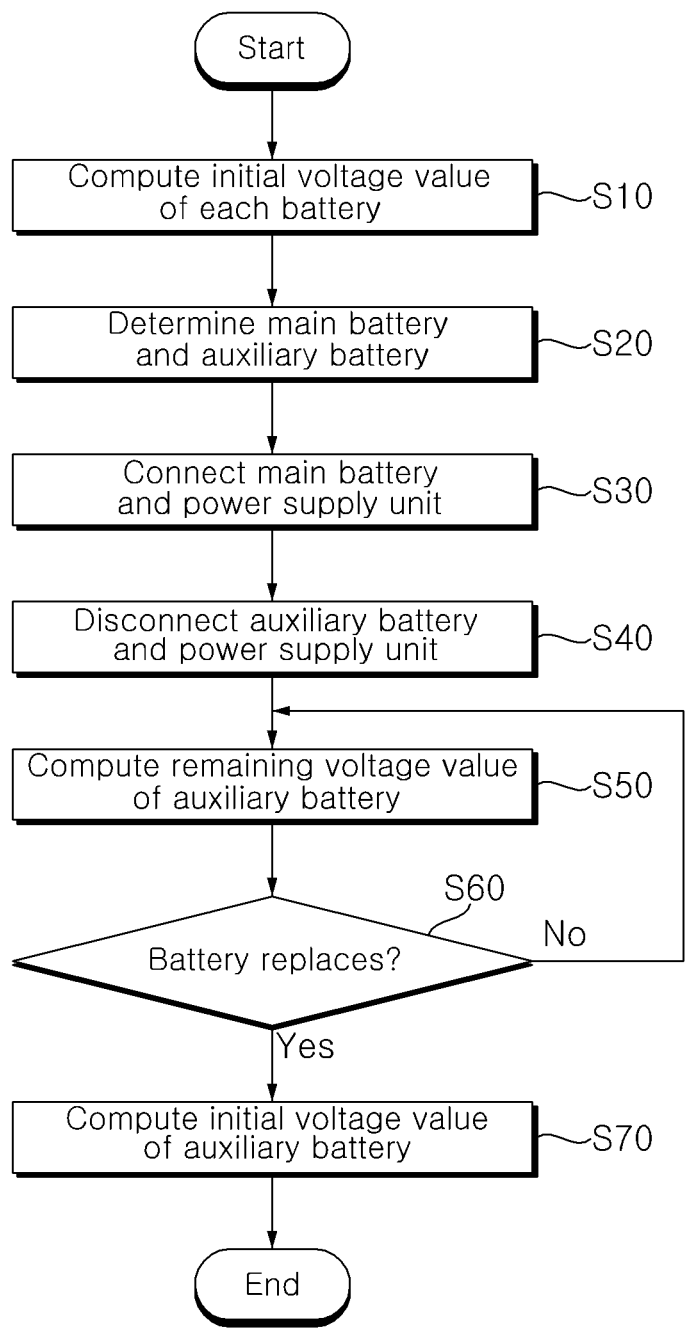
FIG. 10 is a flowchart illustrating a control method of a battery management device according to an embodiment of the present disclosure.

Referring to FIG. 10, the control method according to an embodiment of the present disclosure computes the initial voltage value of each battery 111 (S10). Specifically, the battery controller 560 computes the initial voltage value of each of the plurality of batteries 111 and stores each initial voltage value in the storage 18.

Thereafter, the battery controller 560 selects the main battery and the auxiliary battery from among the plurality of batteries 111 (S20). Specifically, the battery controller 560 may select the battery 111 with the largest initial voltage value as the main battery and select the remaining batteries 111 as auxiliary batteries.

Thereafter, the battery controller 560 connects the main battery and the power supply unit 520 (S30) and disconnects the auxiliary battery and the power supply unit 520 (S40). Specifically, referring to FIG. 8B, when the first battery 111a is selected as the main battery and the second battery 111b is selected as the auxiliary battery, the first power connection switching unit 511 is in an close state to electrically connect the power supply unit 520 and the first battery 111a, and the second power connection switching unit 512 is in a opened state to electrically disconnect the power supply unit 520 and the second battery 111b.

Thereafter, the battery controller 560 periodically measures the remaining voltage value of the auxiliary battery (S50). Specifically, the battery controller 560 may connect the auxiliary battery and the voltage detection unit 550 for a first time period T1 and periodically repeat disconnection for a second time period T2. The battery controller 560 may connect the second battery 111b and the second voltage detection unit 552 for the first time period T1 and periodically repeat disconnection for the second time period T2. The battery controller 560 may detect the output voltage of the auxiliary battery and calculate the remaining voltage value while the auxiliary battery and the voltage detection unit 550 are connected. The battery controller 560 may detect the output voltage of the auxiliary battery and calculate the remaining voltage value during the first time period T1 when the auxiliary battery and the second power connection switching unit 512 are closed.

Thereafter, the battery controller 560 determines whether to replace the auxiliary battery (S60). Specifically, the battery controller 560 may determine that the auxiliary battery has been replaced when the remaining average voltage value is less than the first voltage and then becomes greater than or equal to the first voltage.

Thereafter, when it is determined that the auxiliary battery has been mounted again, the battery controller 560 outputs battery 111 replacement information through the output unit 17 and computes the initial voltage value of the replaced auxiliary battery (S70). When it is determined that the auxiliary battery has been mounted again, the battery controller 560 may store the initial voltage value of the replaced auxiliary battery in the storage 18.

Thereafter, the battery controller 560 may determine whether to select the auxiliary battery as the main battery by comparing the output voltage of the main battery with the initial voltage value of the replaced auxiliary battery.

The invention claimed is:

1. A battery management device, comprising:
   a power supply unit which generates an operating power supply voltage from a plurality of batteries;
   a power connection switching unit which performs connection or disconnection of the power supply unit to or from each of the batteries;
   a plurality of voltage detection units which detect output voltages output from the respective batteries;
   a detection connection switching unit which performs connection or disconnection of each of the batteries to or from each of the voltage detection units; and
   a battery controller which controls the power connection switching unit and the detection connection switching unit based on information input from the voltage detection units,
   wherein the battery controller selects, as a main battery, one of the plurality of batteries based on the output voltages, selects remaining batteries as an auxiliary battery, and connects the auxiliary battery to the voltage detection units for a first time period, and periodically repeats disconnection for a second time period.

2. The device of claim 1, wherein the battery controller detects the output voltage of the auxiliary battery while the auxiliary battery and the voltage detection unit are connected.

3. The device of claim 2, wherein the battery controller:
   calculates a remaining voltage value from the output voltage of the auxiliary battery; and
   determines that the auxiliary battery has been removed when the remaining voltage value is less than a first voltage value.

4. The device of claim 1, wherein the battery controller:
   calculates a remaining voltage value from the output voltage of the auxiliary battery; and
   determines that the auxiliary battery is installed when the remaining average voltage value is greater than or equal to a first voltage value.

5. The device of claim 1, wherein the battery controller:
   calculates a remaining voltage value from the output voltage of the auxiliary battery; and
   computes an initial voltage value of the auxiliary battery when the remaining voltage value is less than a first voltage and then becomes greater than the first voltage or equal to the first voltage.

6. The device of claim 5, wherein the initial voltage value of the auxiliary battery is an average value of output voltage values of the auxiliary battery measured multiple times at an interval of a fourth time period during a third time period.

7. The device of claim 6, wherein:
   the third time period is shorter than the second time period and longer than the second time period;
   the second time period is longer than the fourth time period; and
   the first time period is shorter than the second time period.

8. The device of claim 1, wherein the battery controller:
   computes an initial voltage value of each of the plurality of batteries;
   selects a battery with the largest initial voltage value as the main battery; and
   selects the remaining batteries as the auxiliary battery.

9. The device of claim 1, wherein the battery controller connects the main battery and the power supply unit and disconnects the auxiliary battery and the power supply unit.

10. The device of claim 3, wherein the remaining voltage value of the auxiliary battery is an average value of output voltage values of the auxiliary battery measured multiple times at an interval of a fifth time period during the first time period.

11. A battery management device, comprising:
    a power supply unit which generates an operating power supply voltage from a plurality of batteries;
    a power connection switching unit which performs connection or disconnection of the power supply unit to or from each of the batteries;
    a plurality of voltage detection units which detect output voltages output from the respective batteries;
    a detection connection switching unit which performs connection or disconnection of each of the batteries to or from each of the voltage detection units; and
    a battery controller which controls the power connection switching unit and the detection connection switching unit based on information input from the voltage detection units,
    wherein the battery controller computes an initial voltage value of each of the batteries, selects, as a main battery, one of the plurality of batteries based on the initial voltage value of each of the batteries, selects remaining batteries as an auxiliary battery, and calculates a remaining voltage value from the output voltage of the auxiliary battery at an interval of a sixth time period,
    wherein the remaining voltage value is an average value of the output voltage of the auxiliary battery during a seventh time period, and
    wherein the sixth time period is longer than the seventh time period.

12. The device of claim 11, wherein:
    the initial voltage value of each of the batteries is an average value of output voltage values of each of the batteries measured multiple times at an interval of a fourth time period during a third time period; and
    the sixth time period is longer than the third time period.

13. The device of claim 12, wherein the third time period is longer than the seventh time period.

14. The device of claim 12, wherein:
    the remaining voltage value is an average value of output voltage values of the auxiliary battery measured multiple times at an interval of a fifth time period during the seventh time period; and
    the interval of the fifth time period is greater than the interval of the fourth time period.

15. The device of claim 14, wherein the number of measurements of the output voltage value of the auxiliary battery measured at the interval of the fifth time period is smaller than the number of measurements of the output voltage value of each of the batteries measured at the interval of the fourth time period.

16. The device of claim 11, wherein the battery controller connects the auxiliary battery and the voltage detection unit for a first time period, periodically repeats disconnection for a second time period, and detects the output voltage of the auxiliary battery while the auxiliary battery and the voltage detection unit are connected.

17. The device of claim 11, wherein the battery controller selects a battery with the largest initial voltage value as the main battery and selects the remaining batteries as the auxiliary battery.

18. The device of claim 11, wherein the battery controller connects the main battery and the power supply unit and disconnects the auxiliary battery and the power supply unit.

19. The device of claim 11, wherein, when the remaining average voltage value is less than a first voltage value, the battery controller determines that the auxiliary battery has been removed.

20. A battery management device, comprising:
a power supply unit which generates an operating power supply voltage from a plurality of batteries;
a power connection switching unit which performs connection or disconnection of the power supply unit to or from each of the batteries;
a plurality of voltage detection units which detect output voltages output from the respective batteries;
a detection connection switching unit which performs connection or disconnection of each of the batteries to or from each of the voltage detection units; and
a battery controller which controls the power connection switching unit and the detection connection switching unit based on information input from the voltage detection units,
wherein the battery controller selects, as a main battery, one of the plurality of batteries based on the output voltages, selects remaining batteries as an auxiliary battery, and alternately executes a connection state for connecting the auxiliary battery and the voltage detection unit and a disconnection state for disconnecting the auxiliary battery and the voltage detection unit.

21. A mobile robot, comprising:
a body;
a wheel unit installed on the body to move the body;
a plurality of batteries supplying power to drive the body; and
a battery management device for managing the plurality of batteries,
wherein the battery management device comprises:
a power supply unit which generates an operating power supply voltage from a plurality of batteries;
a power connection switching unit which performs connection or disconnection of the power supply unit to or from each of the batteries;
a plurality of voltage detection units which detect output voltages output from the respective batteries;
a detection connection switching unit which performs connection or disconnection of each of the batteries to or from each of the voltage detection units; and
a battery controller which controls the power connection switching unit and the detection connection switching unit based on information input from the voltage detection units,
wherein the battery controller selects, as a main battery, one of the plurality of batteries based on the output voltages, selects remaining batteries as an auxiliary battery, and connects the auxiliary battery to the voltage detection units for a first time period, and periodically repeats disconnection for a second time period.

* * * * *